(12) United States Patent
Lee et al.

(10) Patent No.: US 8,895,991 B2
(45) Date of Patent: Nov. 25, 2014

(54) ORGANIC ELECTROLUMINESCENT DISPLAY AND METHOD OF MANUFACTURING THE SAME

(71) Applicant: Samsung Display Co., Ltd., Yongin (KR)

(72) Inventors: A Rong Lee, Yongin (KR); Young-il Kim, Yongin (KR); Euigyu Kim, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/906,199

(22) Filed: May 30, 2013

(65) Prior Publication Data
US 2014/0131671 A1 May 15, 2014

(30) Foreign Application Priority Data

Nov. 13, 2012 (KR) ........................ 10-2012-0128327

(51) Int. Cl.
*H01L 33/36* (2010.01)
*H01L 21/00* (2006.01)
*H01L 51/50* (2006.01)

(52) U.S. Cl.
CPC .................................. *H01L 51/5008* (2013.01)
USPC ........... 257/72; 257/83; 257/E33.064; 438/34

(58) Field of Classification Search
CPC . H01L 51/5012; H01L 51/56; H01L 2227/32; H01L 2227/323; H01L 27/1214; H01L 27/3258; H01L 27/3246; H01L 27/3248
USPC ........................ 257/72, 83, E33.064; 438/34
See application file for complete search history.

(56) References Cited

U.S. PATENT DOCUMENTS

| 2004/0108808 | A1 | 6/2004 | Kumagai et al. |
| 2010/0308317 | A1 | 12/2010 | Ahn et al. |
| 2014/0034933 | A1* | 2/2014 | Okumoto et al. ............... 257/40 |
| 2014/0077182 | A1* | 3/2014 | Kim et al. ........................ 257/40 |

FOREIGN PATENT DOCUMENTS

| KR | 10-0578283 B1 | 5/2006 |
| KR | 10-0647710 B1 | 11/2006 |

* cited by examiner

*Primary Examiner* — Minh-Loan T Tran
(74) *Attorney, Agent, or Firm* — Knobbe Martens Olson & Bear LLP

(57) ABSTRACT

An organic electroluminescent display and method of manufacturing the same are disclosed. In one aspect, the organic electroluminescent display includes a substrate and a first electrode disposed on the substrate. It also includes a pixel definition layer disposed on the first electrode, wherein the pixel definition layer has an opening portion formed in an area overlapped with the first electrode. It further includes a lyophilic layer disposed on the first electrode and the pixel definition layer, an organic light emitting layer disposed on the lyophilic layer, and a second electrode disposed on the organic light emitting layer. The lyophilic layer includes a center portion and an edge portion. The center portion is disposed on the first electrode through the opening portion and includes at least one recess portion formed therein. The edge portion is extended from the center portion and disposed on the pixel definition layer.

20 Claims, 10 Drawing Sheets

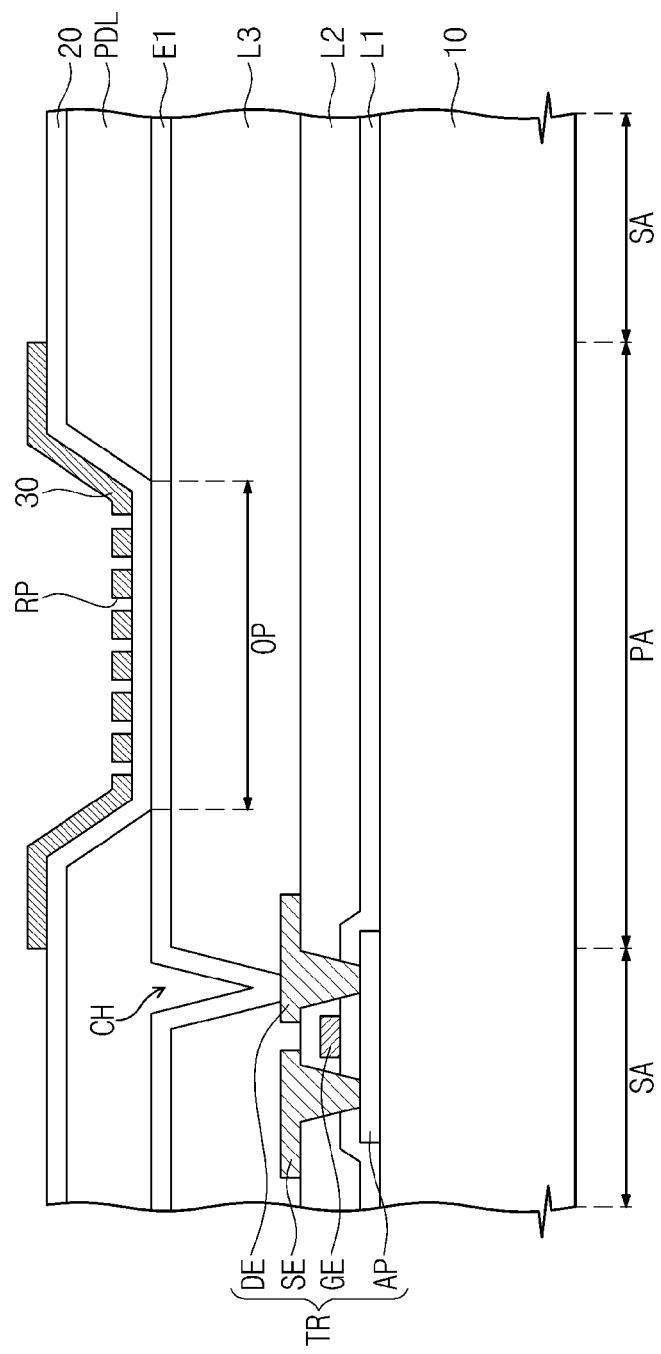

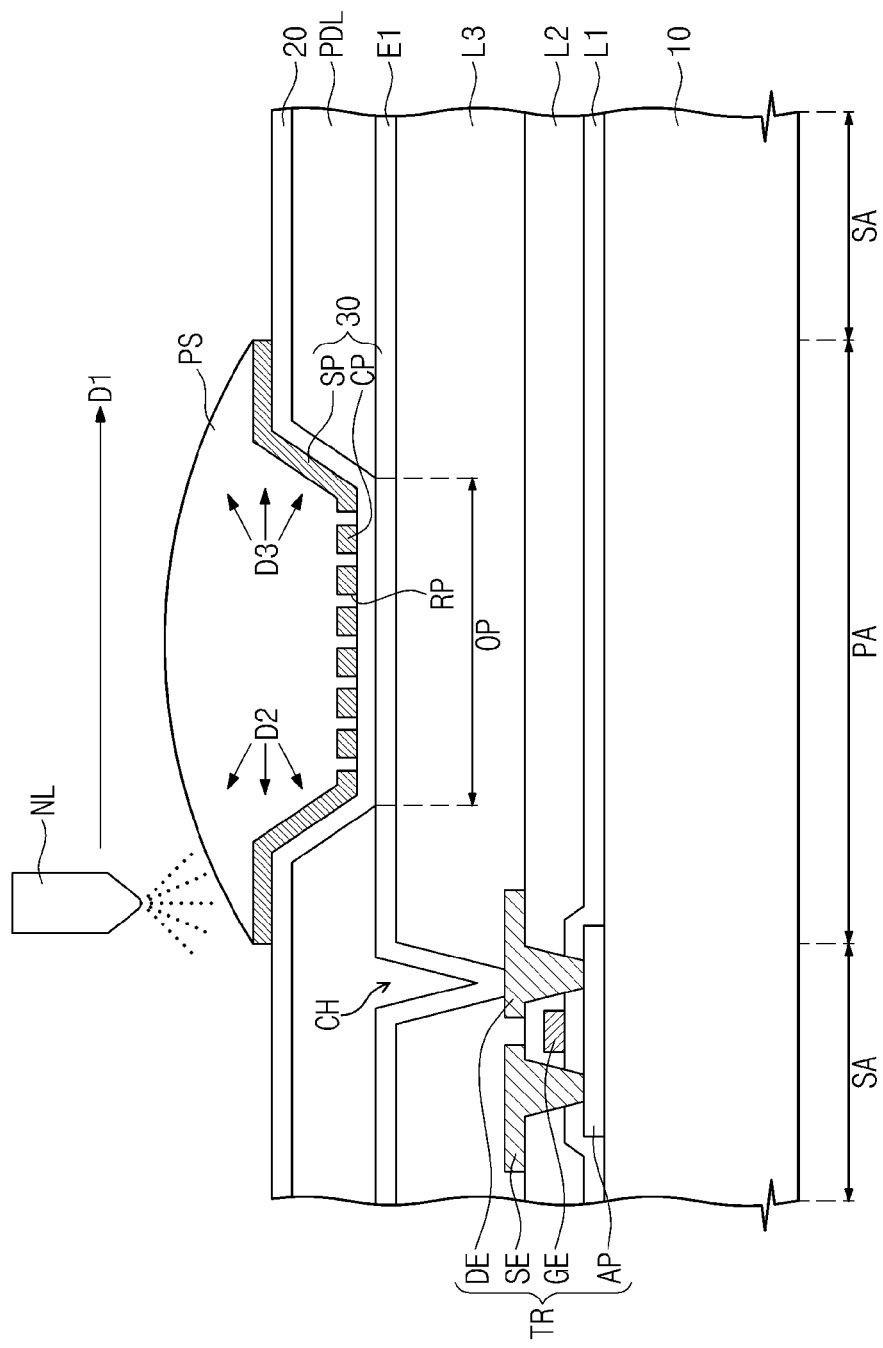

ORGANIC ELECTROLUMINESCENT DISPLAY AND METHOD OF MANUFACTURING THE SAME

CROSS-REFERENCE TO RELATED APPLICATIONS

This U.S. non-provisional patent application claims priority under 35 U.S.C. §119 of Korean Patent Application No. 10-2012-0128327, filed on Nov. 13, 2012, the contents of which are hereby incorporated by reference.

BACKGROUND

1. Field of the Technology

The described technology relates to an organic electroluminescent display and a method of manufacturing the same. More particularly, the present disclosure relates to an organic electroluminescent display capable of improving display quality and a method of manufacturing the same.

2. Description of the Related Technology

In recent years, an organic electroluminescent display has been spotlighted as the next generation display since it is self-emitting and thus does not require a separate light source when compared to a liquid crystal display. Accordingly, the organic electroluminescent display is light and slim. In addition, organic electroluminescent displays have other valuable properties such as fast response speed, low driving voltage, and high brightness.

In general, each pixel of an organic electroluminescent display includes an anode, a cathode, and an organic light emitting layer. Holes and electrons are injected into the organic emitting layer through the anode and the cathode respectively. They are recombined in the organic light emitting layer to generate excitons (electron-hole pairs). The excitons emit energy, which is discharged as light when an excited state returns to a ground state.

Meanwhile, as the thickness of the organic light emitting layer becomes more uniform, the brightness of the organic light emitting layer also becomes more uniform. Accordingly, to improve the quality of the organic electroluminescent display, a uniform thickness of the organic light emitting layer is needed.

SUMMARY OF CERTAIN INVENTIVE ASPECTS

One inventive aspect is an organic electroluminescent display capable of improving the display quality thereof.

Another aspect is a method of manufacturing the organic electroluminescent display.

In some embodiments, an organic electroluminescent display comprises a substrate, a first electrode disposed on the substrate, a pixel definition layer disposed on the first electrode and provided with an opening portion formed in an area overlapped with the first electrode, a lyophilic layer having a lyophilic property and disposed on the first electrode and the pixel definition layer, an organic light emitting layer disposed on the lyophilic layer, and a second electrode disposed on the organic light emitting layer.

The lyophilic layer includes a center portion and an edge portion. The center portion is disposed on the first electrode through the opening portion and includes at least one recess portion formed therein, and the edge portion is extended from the center portion and disposed on the pixel definition layer.

A method of manufacturing an organic electroluminescent display is provided as follows. When a first electrode on a substrate including a pixel area and a non-pixel area is formed, a pixel definition layer is formed on the first electrode. The pixel definition layer is provided with an opening portion to expose at least a portion of the first electrode. Then, a preliminary lyophilic layer is formed on the first electrode and the pixel definition layer and the preliminary lyophilic layer is patterned to form a lyophilic layer. After that, a printing solution is applied to the lyophilic layer to form an organic light emitting layer and a second electrode is formed on the organic light emitting layer.

The lyophilic layer is formed by removing the preliminary lyophilic layer disposed in the non-pixel area to form a center portion disposed on the first electrode through the opening portion and an edge portion extended from the center portion to be disposed on the pixel definition layer and forming a recess portion in the center portion.

In some embodiments, when the printing solution is cured to form the organic light emitting layer, a phenomenon, in which the printing solution flows down to a plane area from a slant area, may be prevented even though the printing solution is applied to the plane area and the slant area. Thus, the organic light emitting layer may have uniform thickness. In addition, during the cure of the printing solution, the printing solution is rearranged due to a difference between the surface energy of the plane area and the surface energy of the slant area, and thus the thickness of the organic light emitting layer may be uniform. Consequently, since the thickness of the organic light emitting layer is uniform, the brightness of the light emitted from the organic light emitting layer may be kept substantially uniform, thereby improving the quality of the organic electroluminescent display.

BRIEF DESCRIPTION OF THE DRAWINGS

FIGS. 6A to 6E are views showing a method of manufacturing the organic electroluminescent display shown in FIGS. 1 and 2.

DETAILED DESCRIPTION OF CERTAIN INVENTIVE EMBODIMENTS

Figure 1:
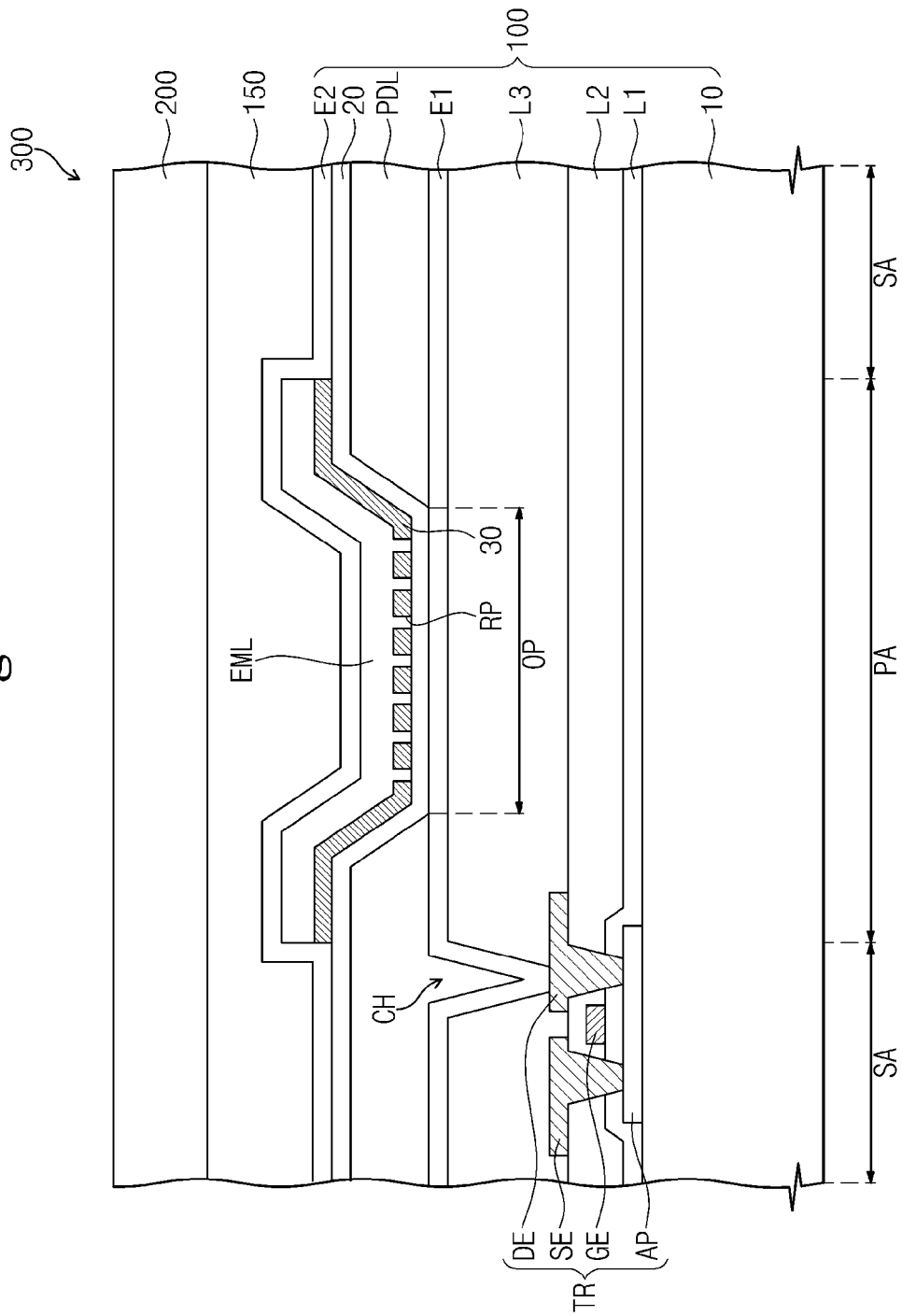
FIG. 1 is a cross-sectional view showing a pixel of an organic electroluminescent display according to an embodiment.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. The same numbers refer to the same or like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative terms used herein should be interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the disclosed technology will be explained in detail with reference to the accompanying drawings.

Figure 2:
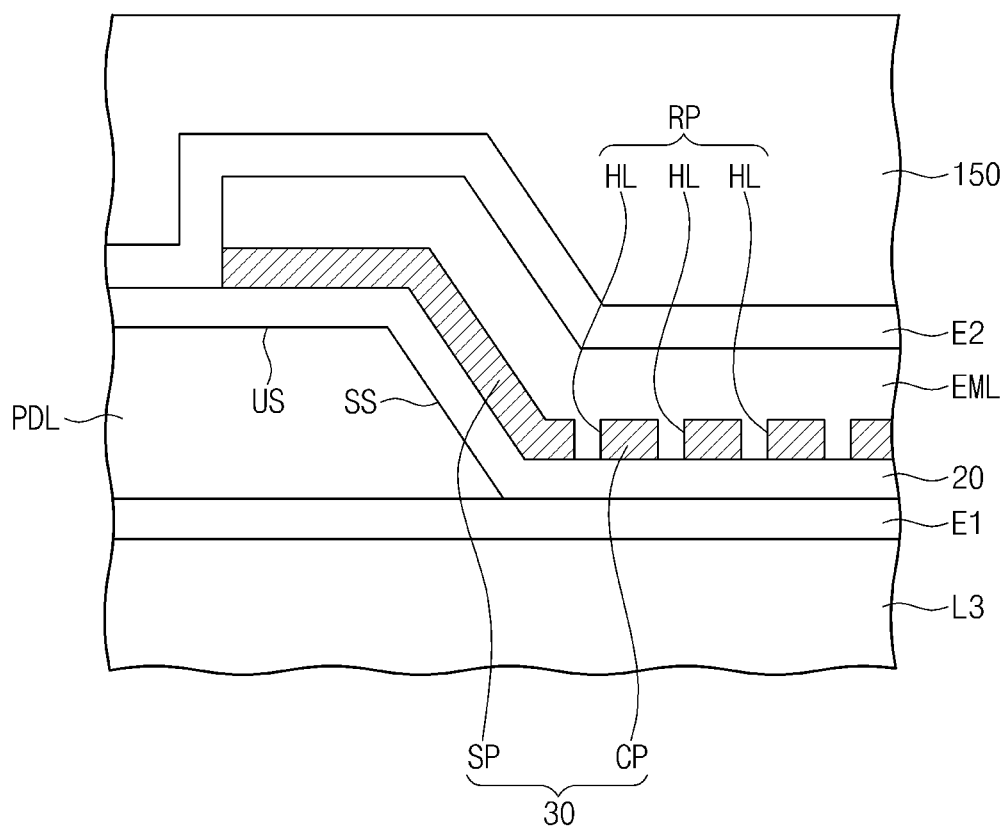
FIG. 2 is an enlarged cross-sectional view showing a portion of the pixel shown in FIG. 1.

FIG. 1 is a cross-sectional view showing a pixel of an organic electroluminescent display according to an embodiment and FIG. 2 is an enlarged cross-sectional view showing a portion of the pixel shown in FIG. 1. In detail, FIG. 2 shows an opening portion OP of a pixel definition layer PDL shown in FIG. 1 and a surrounding of the opening portion OP. Meanwhile, the organic electroluminescent display 300 includes a plurality of pixels, but the pixels have the same configuration and function. Thus, only one pixel disposed in one pixel area PA will be described in detail with reference to FIGS. 1 and 2, and others will be omitted.

Referring to FIGS. 1 and 2, the organic electroluminescent display 300 includes a display substrate 100, an opposite substrate 200 facing the display substrate 100, and an insulating layer 150 disposed between the display substrate 100 and the opposite substrate 200.

In some embodiments, the display substrate 100 may include a substrate 10, a driver transistor TR, a first electrode E1, the pixel definition layer PDL, a liquid-repellent layer 20, a lyophilic layer 30, an organic light emitting layer EML, and a second electrode E2. The substrate 10 includes a pixel area PA and a non-pixel area SA, and the driver transistor TR is disposed in the non-pixel area SA. The driver transistor TR is electrically connected to the first electrode E1 to switch a power source signal applied to the first electrode E1.

The driver transistor TR includes a gate electrode GE, an active pattern AP, a source electrode SE, and a drain electrode DE. The source electrode SE is electrically connected to a power line (not shown) that transmits the power source signal and the drain electrode DE is electrically connected to the first electrode E1. Accordingly, when the driver transistor TR is turned on, the power source signal transmitted through the power line is applied to the first electrode E1 through the driver transistor TR.

In some embodiments, a gate insulating layer L1 may cover the active pattern AP to insulate the gate electrode GE from the active pattern AP, and an inter-insulating layer L2 covers the gate electrode GE to insulate the gate electrode GE from the source and drain electrodes SE and DE. In addition, a planarization layer L3 covers the driver transistor TR and is provided with a contact hole CH formed therethrough. Thus, the first electrode E1 disposed on the planarization layer L3 is electrically connected to the drain electrode DE through the contact hole CH.

The pixel definition layer PDL is disposed on the first electrode 10 and includes the opening portion OP overlapped with the first electrode E1. In some embodiments, the pixel definition layer PDL may include an upper surface US and a slant surface SS, and the slant surface SS is connected to the upper surface US and extended to the opening portion OP to be inclined to the substrate 10.

The liquid-repellent layer 20 is disposed in the pixel area PA and the non-pixel area SA. In detail, the liquid-repellent layer 20 is disposed between the pixel definition layer PDL and the lyophilic layer 30 and between the first electrode E1 and the lyophilic layer 30. A portion of the liquid-repellent layer 20 makes contact with the first electrode E1 through the opening portion OP.

In some embodiments, the liquid-repellent layer 20 may have a single-layer structure formed over the pixel area PA and the non-pixel area SA, and the liquid-repellent layer 20 may be commonly formed over other pixel areas and other non-pixel areas now shown in FIG. 1.

The liquid-repellent layer 20 includes an organic material that contains fluorine to have a liquid repellent property. Therefore, the wettability between the liquid-repellent layer 20 and a liquid material may be smaller than the wettability between the lyophilic layer 30 having a lyophilic property and the liquid material.

In some embodiments, the liquid-repellent layer 20 may have conductivity in order to allow electrons or holes provided from the first electrode E1 through the liquid-repellent layer 20 to be easily transferred to the organic light emitting layer EML. According to another exemplary embodiment, the liquid-repellent layer 20 has a thickness equal to or smaller than about 50 micrometers. In this case, the liquid-repellent layer 20 may not have conductivity since the electrons or holes provided from the first electrode E1 through the liquid-repellent layer 20 are transferred to the organic light emitting layer EML even though the liquid-repellent layer 20 does not have conductivity.

The lyophilic layer 30 includes an organic material having lyophilic property. Therefore, the wettability between the lyophilic layer 30 and the liquid material is greater than the wettability between the liquid-repellent layer 20 and the liquid material. In addition, the lyophilic layer 30 has a thickness equal to or smaller than about 50 micrometers. In this case, the electrons or holes provided from the first electrode E1 are transferred to the organic light emitting layer EML through the lyophilic layer 30 even though the lyophilic layer 30 does not have conductivity.

Figure 6A:
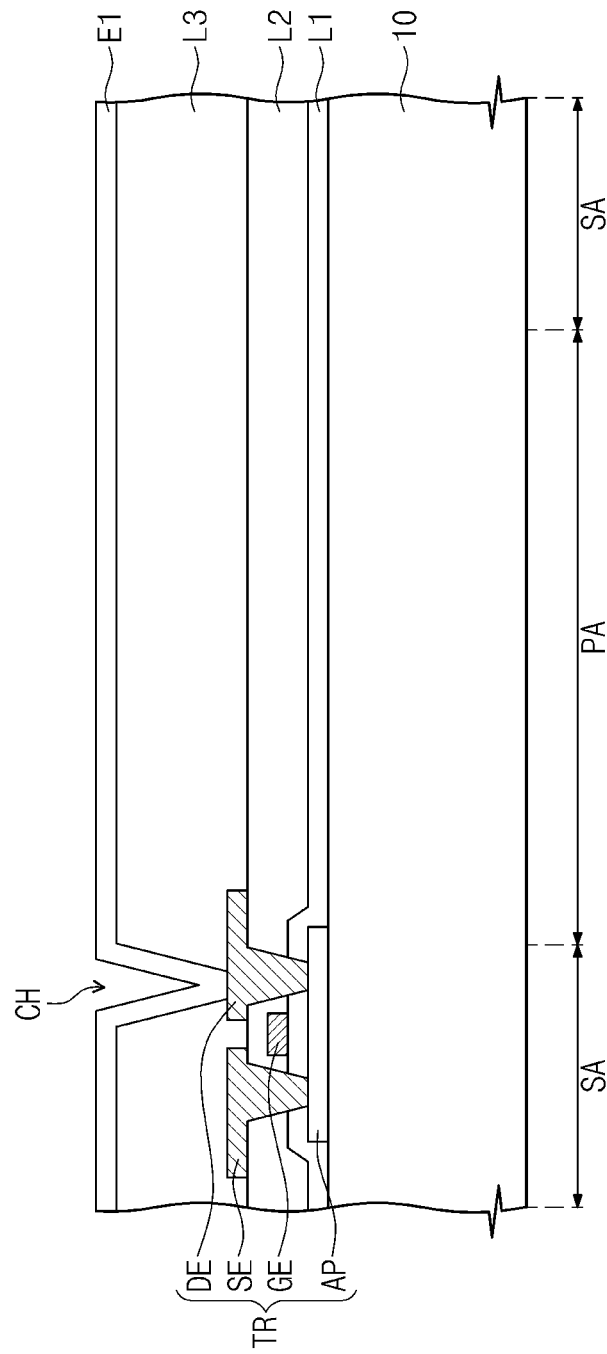

The lyophilic layer 30 is disposed on the liquid-repellent layer 20 in the pixel area PA. In detail, the lyophilic layer 30 is disposed in the pixel area PA among the pixel area PA and the non-pixel area SA. Thus, the liquid-repellent layer 20 and the lyophilic layer 30 are sequentially stacked on the substrate 10 in the pixel area PA, and only the liquid-repellent layer 20 among the liquid-repellent layer 20 and the lyophilic layer 30 is disposed on the substrate 10 in the non-pixel area SA. In this case, a printing solution PS (as shown in FIG. 6D) is easily applied to the pixel area PA among the pixel area PA and the non-pixel area SA using a printing method, and the printing solution is cured to form the organic light emitting layer EML. This will be described in detail with reference to FIGS. 6A to 6E.

Meanwhile, the lyophilic layer 30 includes a center portion CP and an edge portion SP extended from the center portion CP. The center portion CP is disposed on the first electrode E1 through the opening portion OP to be parallel to the substrate 10. In addition, the edge portion SP is disposed on the slant surface SS and the upper surface US of the pixel definition layer PDL, and a portion of the edge portion SP, which is disposed on the slant surface SS, is inclined with respect to the substrate 10.

In some embodiments, at least one recess portion RP may be formed in the center portion CP. In the embodiment shown in FIGS. 1 and 2, the recess portion RP may be defined by holes HL formed penetrating through the lyophilic layer 30, and the holes HL are spaced apart from each other. Accordingly, the organic light emitting layer EML disposed on the lyophilic layer 30 make partial contact with the liquid-repellent layer 20 through the holes HL. Therefore, the surface energy between the lyophilic layer 30 and the liquid material disposed on the lyophilic layer 30 is reduced by a repulsive force between the liquid-repellent layer 20 and the liquid material making contact with the liquid-repellent layer 20.

As described above, when the recess portion RP is formed through the lyophilic layer 30, a surface energy (hereinafter, referred to as a first surface energy) of an upper surface of the center portion CP is smaller than a surface energy (hereinafter, referred to as a second surface energy) of an upper surface of the edge portion SP. Thus, when the liquid material is applied to the lyophilic layer 30 using the printing method and the liquid material is cured to form a layer on the lyophilic layer 30, a portion of the liquid material applied to the lyophilic layer 30 moves to the edge portion SP from the center portion CP due to a difference between the first and second surface energies to be rearranged. As a result, the liquid material is prevented from flowing down from the edge portion SP to the center portion CP and thus the thickness of the layer formed over the center portion CP and the edge portion SP may be uniform. This will be described in detail with reference to FIGS. 6A to 6E.

The organic light emitting layer EML is disposed on the lyophilic layer 30. The holes provided from the first electrode E1 through the liquid-repellent layer 20 and the lyophilic layer 30 are recombined with the electrons provided from the second electrode E2 in the organic light emitting layer EML, so that the light is emitted from the organic light emitting layer EML.

In some embodiments, the organic light emitting layer EML may be disposed in the pixel area PA. The position of the organic light emitting layer EML is related to the method of forming the organic light emitting layer EML described with reference to FIGS. 6A to 6E.

The second electrode E2 is disposed on the organic light emitting layer EML. The second electrode E2 serves as a cathode and the first electrode E1 serves as an anode. In addition, a hole transport layer (not shown) and an electron injection layer (not shown) may be further disposed between the organic light emitting layer EML and the second electrode E2.

The opposite substrate 200 is disposed to face the display substrate 100 and the insulating layer 150 is filled between the display substrate 100 and the opposite substrate 200. The insulating layer 150 includes a polymer material, e.g., polyimide, and is formed on the entire surface of the display substrate 100 to cover the display substrate 100. Accordingly, the insulating layer 150 blocks gas and humidity to prevent the organic light emitting layer EML from being deteriorated by gas and humidity.

Figure 3:
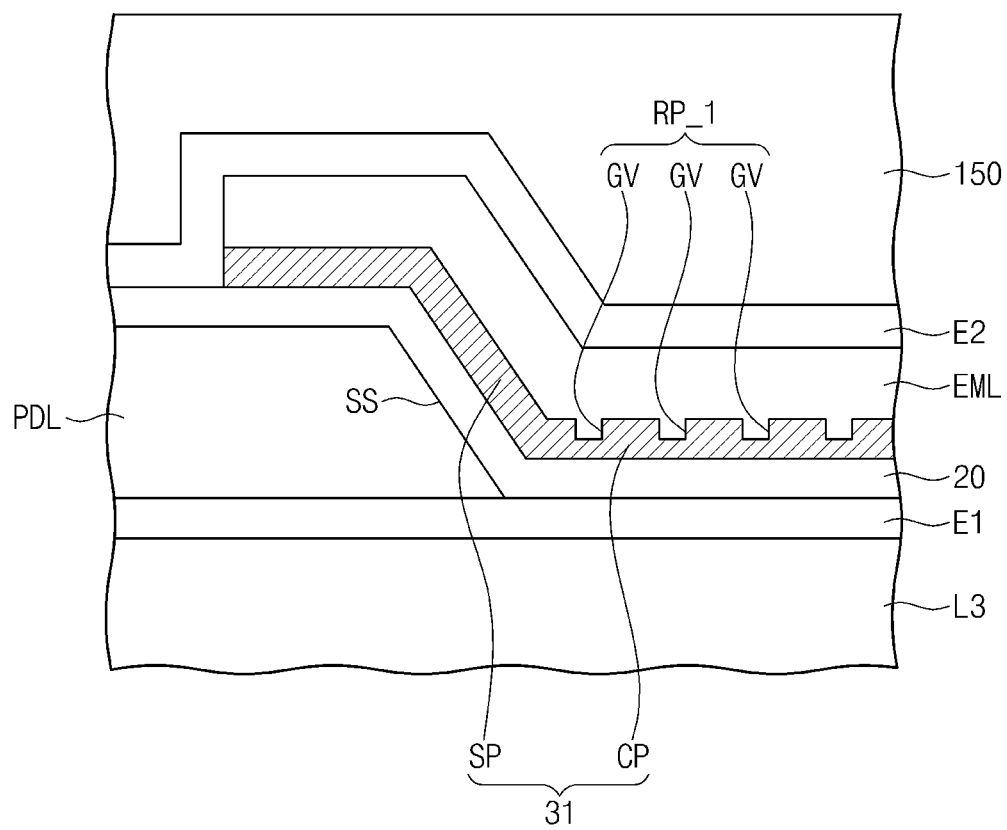
FIG. 3 is an enlarged cross-sectional view showing a pixel of an organic electroluminescent display according to another embodiment.

FIG. 3 is an enlarged cross-sectional view showing a pixel of an organic electroluminescent display according to an embodiment. In detail, FIG. 3 shows a center portion CP and an edge portion SP of a lyophilic layer 31 disposed on a pixel definition layer PDL of the organic electroluminescent display. Meanwhile, the organic electroluminescent display shown in FIG. 3 has the same configuration and function as those of the organic electroluminescent display 300 shown in FIGS. 1 and 2 except for the lyophilic layer 31. In FIG. 3, the same reference numerals denote the same elements in FIGS. 1 and 2, and thus detailed descriptions of the same elements will be omitted.

Referring to FIG. 3, the organic electroluminescent display includes the lyophilic layer 31 and the lyophilic layer 31 includes the center portion CP and the edge portion SP extended from the center portion CP and inclined to the substrate 10. A recess portion RP_1 is formed in the center portion CP, and the recess portion RP_1 is defined by recesses GV formed by removing portions of the lyophilic layer 31 from an upper surface of the center portion CP of the lyophilic layer 31 along the thickness direction of the lyophilic layer 31. In addition, the recesses GV are spaced apart from each other.

As describe above, since the recess portion RP_1 is formed in the lyophilic layer 31, the surface energy of the upper surface of the center portion CP is smaller than the surface energy of the upper surface of the edge portion SP. Thus, as described with reference to FIGS. 1 and 2, when the liquid material is applied to the lyophilic layer 31 and the liquid material is cured to form a layer on the lyophilic layer 31, a portion of the liquid material applied to the lyophilic layer 31 moves to the edge portion SP from the center portion CP to be rearranged. As a result, the liquid material is prevented from flowing down from the edge portion SP to the center portion CP, and thus the thickness of the layer formed over the center portion CP and the edge portion SP may be uniform.

Figure 4:
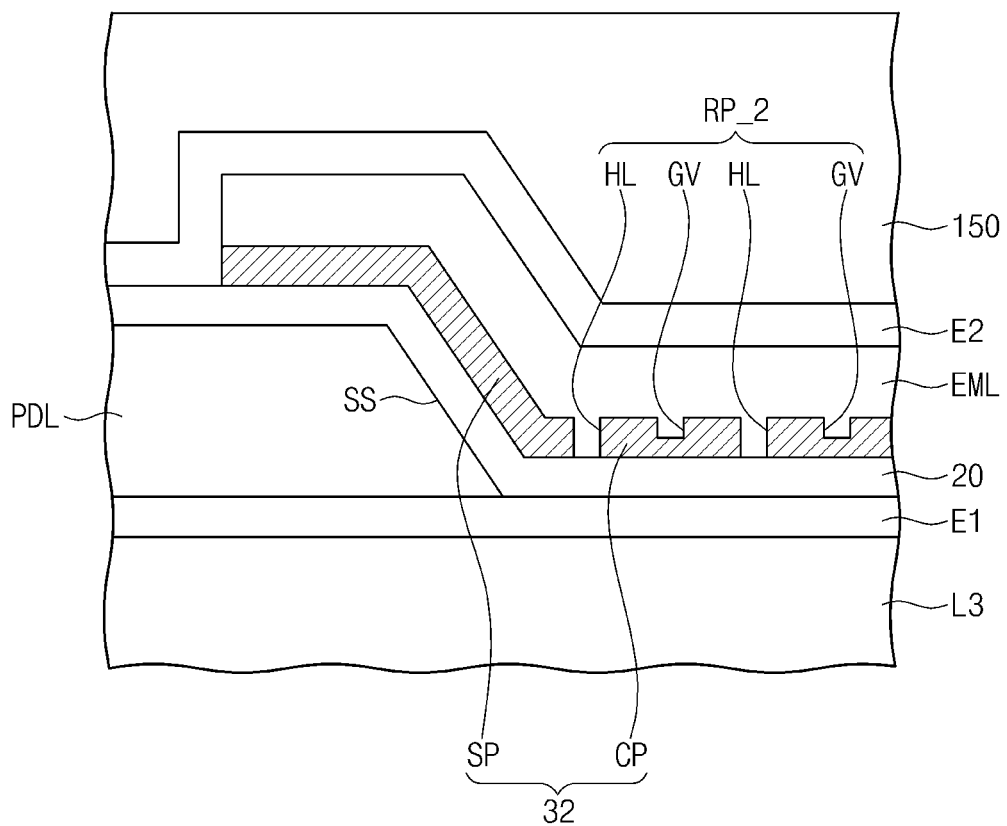
FIG. 4 is an enlarged cross-sectional view showing a pixel of an organic electroluminescent display according to another embodiment.

FIG. 4 is an enlarged cross-sectional view showing a pixel of an organic electroluminescent display according to another embodiment. In detail, FIG. 4 shows a center portion CP and an edge portion SP of a lyophilic layer 32 disposed on a pixel definition layer PDL of the organic electroluminescent display. Meanwhile, the organic electroluminescent display shown in FIG. 4 has the same configuration and function as those of the organic electroluminescent display 300 shown in FIG. 1 except for the lyophilic layer 32. In FIG. 4, the same reference numerals denote the same elements in FIGS. 1 and 2, and thus detailed descriptions of the same elements will be omitted.

Referring to FIG. 4, the organic electroluminescent display includes the lyophilic layer 32 and the lyophilic layer 32 includes the center portion CP and the edge portion SP extended from the center portion CP and inclined to the substrate 10. A recess portion RP_2 is formed in the center portion CP, and the recess portion RP_2 is defined by recesses GV formed by removing portions of the lyophilic layer 32 from an upper surface of the center portion CP of the lyophilic layer 32 along the thickness direction of the lyophilic layer 32 and holes HL formed through the center portion CP of the lyophilic layer 32. In addition, the recesses GV and the holes HL are spaced apart from each other.

As describe above, since the recess portion RP_2 is formed in the lyophilic layer 32, the surface energy of the upper surface of the center portion CP is smaller than the surface energy of the upper surface of the edge portion SP. Thus, as described with reference to FIGS. 1 and 2, when the liquid material is applied on the lyophilic layer 32 and the liquid material is cured to form a layer on the lyophilic layer 32, a portion of the liquid material applied on the lyophilic layer 32 moves to the edge portion SP from the center portion CP to be rearranged. As a result, the liquid material is prevented from flowing down from the edge portion SP to the center portion CP, and thus the thickness of the layer formed over the center portion CP and the edge portion SP may be uniform.

Figure 5:
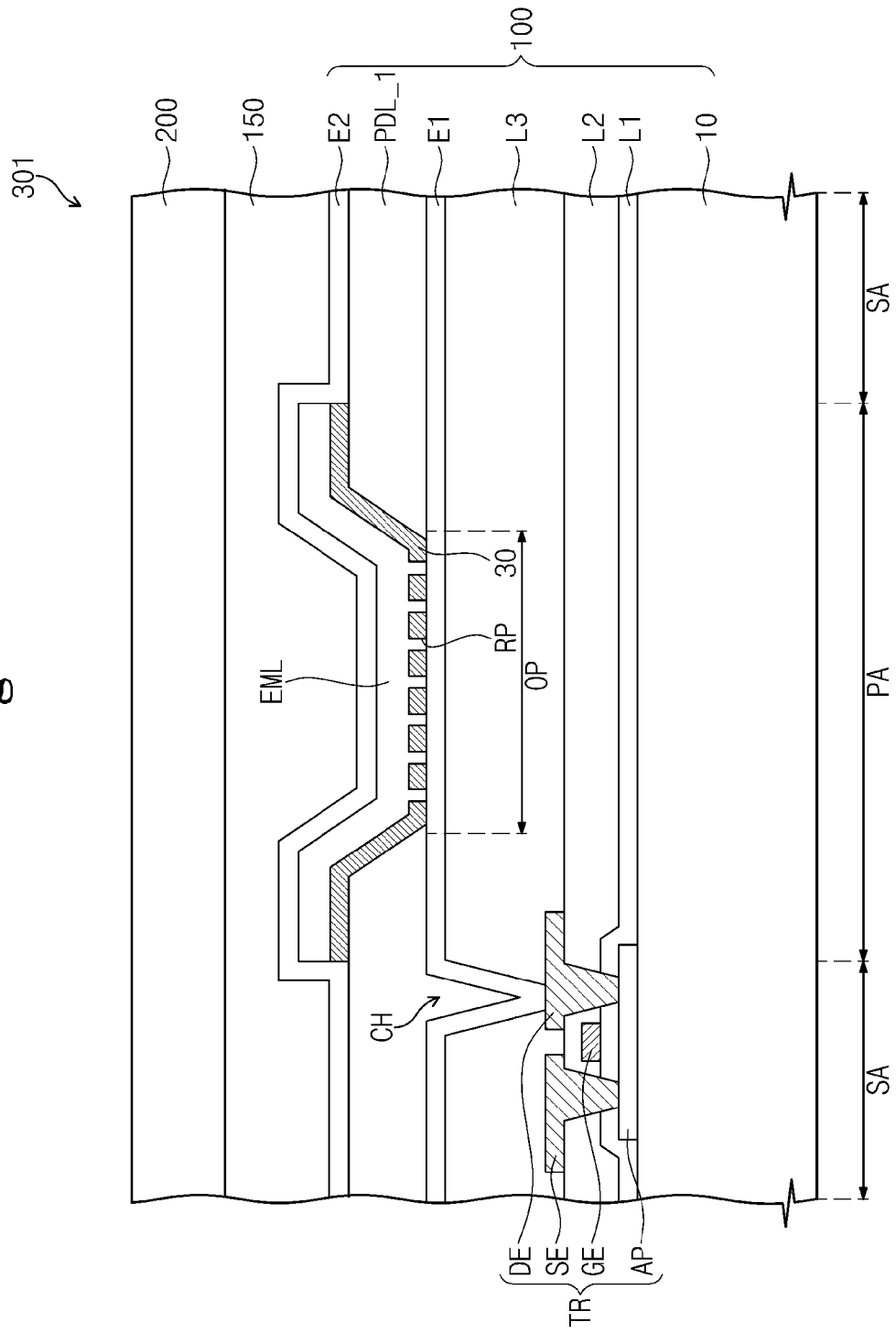
FIG. 5 is a cross-sectional view showing an organic electroluminescent display according to another embodiment.

FIG. 5 is a cross-sectional view showing an organic electroluminescent display according to another embodiment. In FIG. 5, the same reference numerals denote the same elements in FIGS. 1 and 2, and thus detailed descriptions of the same elements will be omitted.

When compared the organic electroluminescent display 301 shown in FIG. 5 to the organic electroluminescent display 300 shown in FIG. 1, the organic electroluminescent display 301 does not include the liquid-repellent layer 20 as shown in FIG. 1. It includes a pixel definition layer PDL_1 having the liquid-repellent property instead of the liquid-repellent layer 20.

Similar to the above-mentioned embodiments, since the lyophilic layer 30 is disposed in the pixel area PA in the organic electroluminescent display shown in FIG. 5, the liquid material is easily applied to the pixel area PA using the printing method, and the organic light emitting layer EML is easily formed by curing the liquid material applied to the pixel area PA.

FIGS. 6A to 6E are views showing a method of manufacturing the organic electroluminescent display shown in FIGS. 1 and 2. In FIGS. 6A to 6E, the same reference numerals denote the same elements in FIGS. 1 and 2, and thus detailed descriptions of the same elements will be omitted.

Referring to FIG. 6A, the driver transistor TR is formed on the substrate 10 including the pixel area PA and the non-pixel area SA and the planarization layer L3 is formed to cover the driver transistor TR. Then, the contact hole CH is formed through the planarization layer L3 to expose the drain electrode DE of the driver transistor TR, and the first electrode E1 is formed on the planarization layer L3. Accordingly, the first electrode E1 makes contact with the drain electrode DE of the driver transistor TR through the contact hole CH.

Figure 6B:
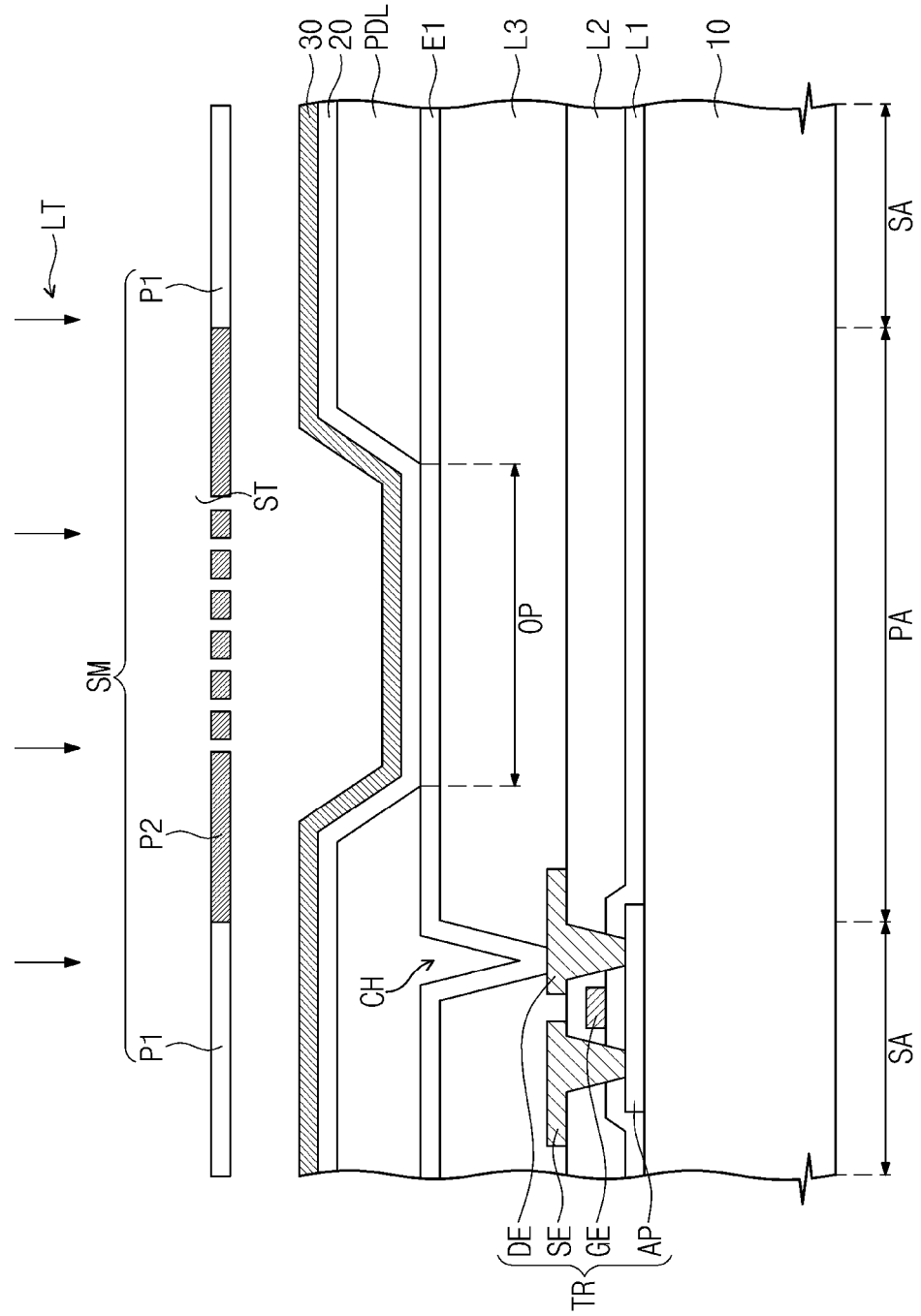

Referring to FIGS. 6B and 6C, the pixel definition layer PDL provided with the opening portion OP formed therethrough is formed on the first electrode E1 to expose a portion of the first electrode E1 through the opening portion OP. After that, the liquid-repellent layer 20 and a preliminary lyophilic layer 30_1 are sequentially formed on the pixel definition layer PDL.

Then, a mask SM is disposed on the preliminary lyophilic layer 30_1. In some embodiments, a mask SM may include a light transmission portion P1 and a light blocking portion P2. The light transmission portion P1 is disposed corresponding to the non-pixel area SA to transmit the light LT. The light blocking portion P2 is disposed corresponding to the pixel area SA to block the light LT. In addition, the light blocking portion P2 includes a slit ST formed therethrough to correspond to the recess portion RP (refer to FIG. 1), and the slit ST transmits the light LT as the light transmission portion P1.

After the mask SM is disposed on the preliminary lyophilic layer 30_1, an exposure process is performed by irradiating the light LT onto the preliminary layer 30_1 and a development process is performed on the preliminary lyophilic layer 30_1 that is exposed to the light LT. As a result, the preliminary lyophilic layer 30_1 is patterned to form the lyophilic layer 30.

According to another embodiment, a photoresist pattern (not shown) is formed on the preliminary lyophilic layer 30_1 to correspond to the light transmission portion P1 and the slit ST, and the preliminary lyophilic layer 30_1 is patterned by using a photolithography process using the photoresist pattern as an etch mask, thereby forming the lyophilic layer 30.

According to still another embodiment, when the pixel definition layer PDL may be formed of a material having the liquid-repellent property, the liquid-repellent layer 20 may be omitted as the organic electroluminescent display shown in FIG. 5.

Referring to FIG. 6D, a nozzle NL moves in a first direction D1 or an opposite direction to the first direction D1 to provide the printing solution PS to the pixel area PA. As a result, the printing solution PS is applied to the lyophilic layer 30.

Meanwhile, before the printing solution PS is applied to the lyophilic layer 30 using the nozzle NL, the lyophilic layer 30 is exposed to the exterior in the pixel area PA and the liquid-repellent layer 20 is exposed to the exterior in the non-pixel area SA. Therefore, the printing solution PS may be easily applied to the pixel area PA since the wettability between the printing solution PS and the lyophilic layer 30 is greater than the wettability between the printing solution PS and the liquid-repellent layer 20.

In addition, when the recess portion RP is formed in the center portion CP of the lyophilic layer 30, the surface energy of the upper surface of the center portion CP is smaller than the surface energy of the upper surface of the edge portion SP due to the recess portion RP, and the liquid-repellent layer 20 is exposed to the exterior through the recess portion RP. Thus, the wettability between the upper surface of the edge portion SP and the printing solution PS is greater than the wettability between the upper surface of the center portion CP, and thus a result, in which the printing solution PS moves to the center portion CP from the edge portion SP after being applied to the pixel area PA, may be prevented. In addition, since the wettability between the upper surface of the edge portion SP and the printing solution PS is greater than the wettability between the upper surface of the center portion CP, the printing solution PS moves to the edge portion SP from the center portion CP along second and third directions D2 and D3. Therefore, the printing solution PS is rearranged, so that the printing solution PS has a uniform thickness.

Figure 6E:
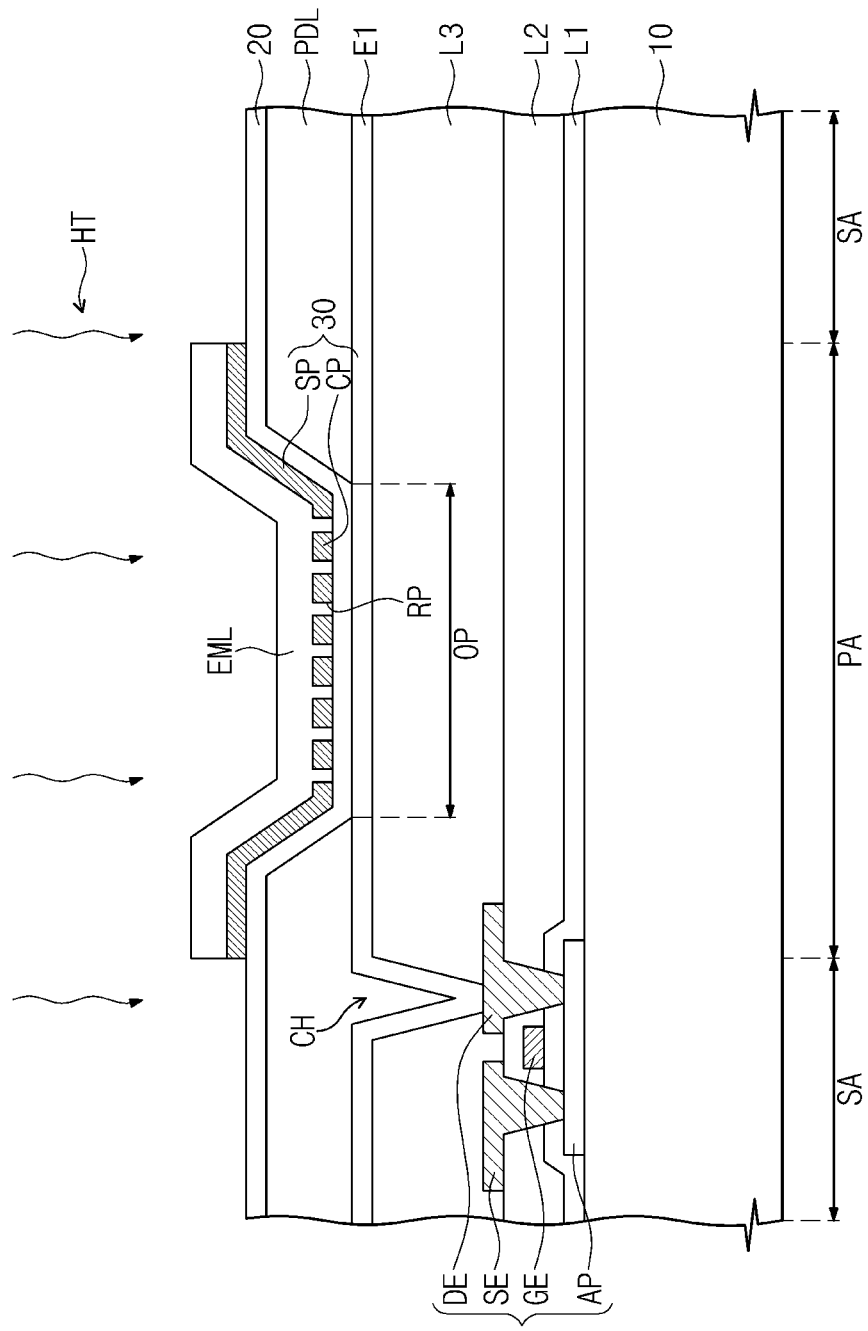

Referring to FIG. 6E, a heat treatment process is performed to apply heat HT to the substrate 10 after the printing solution PS is applied to the pixel area PA. Due to the heat treatment process, the printing solution is cured so as to form the organic light emitting layer EML.

During the heat treatment process, the printing solution PS applied to the center portion CP moves to the edge portion SP by the difference between the surface energy of the upper surface of the center portion CP and the surface energy of the upper surface of the edge portion SP. Therefore, the printing solution PS is rearranged and has a uniform thickness.

As a result, after the heat treatment process is finished, uniformity of the thickness of the organic light emitting layer EML may be improved. In some embodiments, uniformity of the thickness of the organic light emitting layer EML may be prevented from being degraded at the position at which the center portion CP makes contact with the edge portion SP.

Then, the second electrode E2 (refer to FIG. 1) and the insulating layer 150 (refer to FIG. 1) are formed on the organic light emitting layer EML to manufacture the display substrate 100 shown in FIG. 1. After that, the display substrate 100 is coupled to the opposite substrate 200 (refer to FIG. 1), thereby manufacturing the organic electroluminescent display 300.

The above embodiments are presented for illustrative purposes only, and are not intended to define meanings or limit the scope of the present invention as set forth in the following claims. Those skilled in the art will understand that various modifications and equivalent embodiments of the present invention are possible without departing from the spirit and scope of the present invention defined by the appended claims.

What is claimed is:

1. An organic electroluminescent display, comprising:
    a substrate;
    a first electrode disposed on the substrate;
    a pixel definition layer disposed on the first electrode, wherein the pixel definition layer comprises an opening portion formed in an area overlapped with the first electrode;
    a lyophilic layer having a lyophilic property and disposed on the first electrode and the pixel definition layer, wherein the lyophilic layer comprising a center portion disposed on the first electrode through the opening portion, at least one recess portion formed therein, and an edge portion extended from the center portion and disposed on the pixel definition layer;
    an organic light emitting layer disposed on the lyophilic layer; and
    a second electrode disposed on the organic light emitting layer.

2. The organic electroluminescent display of claim 1, wherein the pixel definition layer comprises an upper surface and a slant surface connected to the upper surface and extended to the opening portion, wherein the edge portion is disposed on the slant surface to be inclined with respect to the substrate, and wherein the center portion is substantially in parallel with the substrate.

3. The organic electroluminescent display of claim 2, further comprising a liquid-repellent layer having a liquid-repellent property and disposed between the pixel definition layer and the lyophilic layer and between the first electrode and the lyophilic layer.

4. The organic electroluminescent display of claim 3, wherein a surface energy of the upper surface of the center portion is smaller than a surface energy of an upper surface of the edge portion.

5. The organic electroluminescent display of claim 3, wherein the recess portion comprises a hole formed through the lyophilic layer and the organic light emitting layer, and wherein the organic light emitting layer is configured to make contact with the liquid-repellent layer through the recess portion.

6. The organic electroluminescent display of claim 3, wherein the substrate comprises a pixel area and a non-pixel area, wherein the lyophilic layer is disposed in the pixel area, and wherein the liquid-repellent layer is disposed in the pixel area and the non-pixel area.

7. The organic electroluminescent display of claim 6, wherein the organic light emitting layer is disposed in the pixel area.

8. The organic electroluminescent display of claim 1, wherein the pixel definition layer has a liquid-repellent property.

9. The organic electroluminescent display of claim 8, wherein the substrate comprises a pixel area and a non-pixel area, the pixel definition layer is disposed in the pixel area and the non-pixel area, wherein the opening portion is disposed in the pixel area, and wherein the organic light emitting layer and the lyophilic layer are disposed in the pixel area.

10. The organic electroluminescent display of claim 1, wherein the recess portion comprises a hole formed through the lyophilic layer or a recess formed by partially removing the lyophilic layer from an upper surface of the lyophilic layer along a thickness direction of the lyophilic layer.

11. A method of manufacturing an organic electroluminescent display, comprising:
    forming a first electrode on a substrate, wherein the substrate comprises a pixel area and a non-pixel area;
    forming a pixel definition layer on the first electrode, wherein the pixel definition layer is provided with an opening portion to expose at least a portion of the first electrode;
    forming a preliminary lyophilic layer on the first electrode and the pixel definition layer;
    patterning the preliminary lyophilic layer to form a lyophilic layer;
    applying a printing solution to the lyophilic layer to form an organic light emitting layer; and
    forming a second electrode on the organic light emitting layer, wherein forming of the lyophilic layer comprises
        removing the preliminary lyophilic layer disposed in the non-pixel area to form a center portion disposed on the first electrode through the opening portion and an edge portion extended from the center portion to be disposed on the pixel definition layer; and
        forming a recess portion in the center portion.

12. The method of claim 11, wherein the pixel definition layer comprises an upper surface and a slant surface connected to the upper surface and extended to the opening portion, wherein the edge portion is disposed on the slant surface to be inclined with respect to the substrate, and wherein the center portion is substantially in parallel with the substrate.

13. The method of claim 12, further comprising forming a liquid-repellent layer having a liquid-repellent property and disposed between the pixel definition layer and the lyophilic layer and between the first electrode and the lyophilic layer.

14. The method of claim 13, wherein a surface energy of the upper surface of the center portion is smaller than a surface energy of an upper surface of the edge portion due to the recess portion.

15. The method of claim 13, wherein the recess portion is formed through the lyophilic layer, and wherein the printing solution makes contact with the liquid-repellent layer through the recess portion when the printing solution is applied to the lyophilic layer.

16. The method of claim 13, wherein the lyophilic layer is disposed in the pixel area and the liquid-repellent layer is disposed in the pixel area and the non-pixel area.

17. The method of claim 16, wherein the organic light emitting layer is disposed in the pixel area.

18. The method of claim 11, wherein the pixel definition layer has a liquid-repellent property, wherein the pixel definition layer is disposed in the pixel area and the non-pixel area, wherein the opening portion of the pixel definition layer is disposed in the pixel area, and wherein the organic light emitting layer and the lyophilic layer are disposed in the pixel area.

19. The method of claim 11, wherein the recess portion is formed through the lyophilic layer or formed by partially removing the lyophilic layer from an upper surface of the lyophilic layer along a thickness direction of the lyophilic layer.

20. The method of claim 11, wherein the forming of the organic light emitting layer comprises heat-treating the printing solution applied to the lyophilic layer to cure the printing solution, and the printing solution applied to the center portion of the lyophilic layer moves to the edge portion of the lyophilic layer during the heat-treating of the printing solution to be rearranged.

* * * * *